(12) United States Patent
Iwasaki

(10) Patent No.: US 7,791,082 B2
(45) Date of Patent: Sep. 7, 2010

(54) SEMICONDUCTOR APPARATUS AND METHOD OF MANUFACTURING THE SAME

(75) Inventor: Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 11/859,641

(22) Filed: Sep. 21, 2007

(65) Prior Publication Data

US 2008/0073653 A1    Mar. 27, 2008

(30) Foreign Application Priority Data

Sep. 27, 2006    (JP)    ............... 2006-262619

(51) Int. Cl.
*H01L 27/15*    (2006.01)
(52) U.S. Cl. .............. 257/79; 257/E33.004; 257/85
(58) Field of Classification Search .......... 257/40, 257/41, 43, 79, E33.004
See application file for complete search history.

(56) References Cited

U.S. PATENT DOCUMENTS

| | | | |
|---|---|---|---|
| 6,476,409 B2 | 11/2002 | Iwasaki et al. | 257/13 |
| 6,784,007 B2 | 8/2004 | Iwasaki et al. | 438/22 |
| 7,061,014 B2 | 6/2006 | Hosono et al. | 257/43 |
| 7,189,992 B2 | 3/2007 | Wager, III et al. | 257/43 |
| 7,224,224 B2 | 5/2007 | Sera et al. | 330/253 |
| 2003/0218222 A1 | 11/2003 | Wager, III et al. | 257/410 |
| 2006/0113565 A1* | 6/2006 | Abe et al. | 257/197 |
| 2006/0138394 A1 | 6/2006 | Den et al. | 257/3 |
| 2007/0063211 A1 | 3/2007 | Iwasaki | 257/98 |
| 2007/0194379 A1 | 8/2007 | Hosono et al. | 257/347 |

FOREIGN PATENT DOCUMENTS

| | | |
|---|---|---|
| JP | 05-251705 | 9/1993 |
| JP | 2000-044236 | 2/2000 |
| JP | 2004-103957 | 4/2004 |
| JP | 2004-128487 | 4/2004 |
| WO | 2005/088726 | 9/2005 |
| WO | 2005/093848 | 10/2005 |
| WO | 2005/093850 | 10/2005 |
| WO | 2005/093851 | 10/2005 |

OTHER PUBLICATIONS

P. F. Carcia, et al., "Transparent ZnO thin-film transistor fabricated by rf magnetron sputtering", Applied Physics Letters, vol. 82, No. 7, Feb. 17, 2003, pp. 1117-1119.

(Continued)

*Primary Examiner*—Jerome Jackson, Jr.
*Assistant Examiner*—Dale Page
(74) *Attorney, Agent, or Firm*—Fitzpatrick, Cella, Harper & Scinto

(57) ABSTRACT

It is an object of the present invention to provide a technology of controlling a threshold voltage of a thin film transistor in which an amorphous oxide film is applied to a channel layer. There is provided a semiconductor apparatus including a plurality of kinds of transistors, each of the plurality of kinds of transistors including a channel layer made of an amorphous oxide containing a plurality of kinds of metal elements; and threshold voltages of the plurality of kinds of transistors are different from one another by changing an element ratio of the amorphous oxide.

5 Claims, 8 Drawing Sheets

OTHER PUBLICATIONS

E. Fortunato, et al., "High field-effect mobility zinc oxide thin film transistors produced at room temperature", Journal of Non-Crystalline Solids, vol. 338-340, 2004, pp. 806-809.

Elvira M. C. Fortunato, et al., "Wide-bandgap high-mobility ZnO thin-film transistors produced at room temperature", vol. 85, No. 13, Sep. 27, 2004, pp. 2541-2543.

Y. W. Heo, et al., "Depletion-mode ZnO nanowire field-effect transistor", Applied Physics Letters, vol. 85, No. 12, Sep. 20, 2004, pp. 2274-2276.

R. L. Hoffman, et al., "ZnO-based transparent thin-film transistors", Applied Physics Letters, vol. 82, No. 5, Feb. 3, 2003, pp. 733-735.

Y. Kwon, et al., "Enhancement-mode thin-film field-effect transistor using phosphorus-doped (Zn,Mg)O channel", Applied Physics Letters, vol. 84, No. 14, Apr. 5, 2004, pp. 2685-2687.

Junya Nishii, et al., "High Mobility Thin Film Transistors with Transparent ZnO Channels", Jpn. J. Appl. Phys., vol. 42, Pt. 2, No. 4A, Apr. 1, 2003, pp. L347-L349.

Kenji Nomura, et al., "Carrier transport of extended and localized states in $InGaO_3(ZnO)_5$", Mat. Res. Soc. Symp. Proc., vol. 811, 2004, pp. E2.9.1-E2.9.6.

Yutaka Ohya, et al., "Thin Film Transistor of ZnO Fabricated by Chemical Solution Deposition", Jpn. J. Appl. Phys., vol. 40, Pt. 1, No. 1, Jan. 2001, pp. 297-298.

Keisuke Shibuya, et al., "Single crystal $SrTiO_3$ field-effect transistor with an atomically flat amorphous $CaHfO_3$ gate insulator", Applied Physics Letters, vol. 85, No. 3, Jul. 19, 2004, pp. 425-427.

Akihiro Takagi, et al., "Carrier transport and electronic structure in amorphous oxide semiconductor, a-$InGaZnO_4$", Thin Solid Films, vol. 486, 2005, pp. 38-41.

Hisato Yabuta, et al., "High-mobility thin-film transistor with amorphous $InGaZnO_4$ channel fabricated by room temperature rf-magnetron sputtering", Applied Physics Letters, vol. 89, 2006, pp. 112123-1 to 112123-3.

Kenji Nomura, et al., "Room-temperature fabrication of transparent flexible thin-film transistors using amorphous oxide semiconductors", Nature, vol. 432, Nov. 25, 2004, pp. 488-492.

\* cited by examiner

E/E INVERTER

E/D INVERTER

SEMICONDUCTOR APPARATUS AND METHOD OF MANUFACTURING THE SAME

BACKGROUND OF THE INVENTION

1. Field of the Invention

The present invention relates to a semiconductor apparatus using an amorphous oxide semiconductor, and to a method of manufacturing the same. In particular, the present invention relates to a semiconductor apparatus including a plurality of amorphous oxide semiconductors having different compositions, and to a method of manufacturing the same. In addition, the present invention relates to a semiconductor apparatus including a plurality of thin film transistors having different threshold voltages, and to a method of manufacturing the same.

2. Description of the Related Art

A field effect transistor (FET) is a 3-terminal device having a gate electrode, a source electrode, and a drain electrode. The FET is an electronic active element having a function of switching the current flowing between the source electrode and the drain electrode by applying a voltage to the gate electrode to control a current flowing through a channel layer.

Particularly, an FET formed by using a thin film as a channel layer, which is formed on an insulating substrate made of, for example, ceramics, glass, or plastic, is called a thin film FET (thin film transistor, TFT).

The TFT is formed by using a thin film technology, so that the TFT has an advantage of being easily formed on the substrate having a relatively large area, and therefore is widely used as a drive element for a flat panel display element such as a liquid crystal display element.

In other words, an active liquid crystal display element (ALCD) turns on/off each image pixel by using TFTs formed on a glass substrate.

Further, in a future high-performance organic LED display (OLED), current drive for each pixel by TFTs is thought to be effective.

In addition, a liquid crystal display device having a higher performance is realized in which a TFT circuit having a function of driving and controlling an entire image is formed on a substrate placed in the periphery of an image display region.

A TFT which is most widely used at present is an element having a channel layer formed of a polysilicon film or an amorphous silicon film. The TFT is called a metal-insulator-semiconductor field effect transistor (MIS-FET) device.

For driving pixels, an amorphous silicon TFT is put into practical use, and for driving and controlling the entire image, a polysilicon TFT having a high performance is put into practical use.

However, it is difficult to form the amorphous silicon TFT and the polysilicon TFT on the substrate such as a plastic plate or a film because a high-temperature process is necessary for forming a device.

On the other hand, in recent years, development for realizing a flexible display by forming TFTs on a polymer plate or a film and using the TFTs as drive circuits for an LCD or an OLED has been vigorously conducted.

As a material capable of being formed on the plastic film or the like, organic semiconductor films which can be formed at low temperature and exhibits electric conductivity have been attracting attention.

For example, as the organic semiconductor films, research and development of pentacene or the like are advanced.

These organic semiconductor films each include an aromatic ring, and a large carrier mobility is obtained in a stacking direction of the aromatic rings when they are crystallized.

For example, it is reported that, in a case where pentacene is used as a channel layer, the carrier mobility is about 0.5 $cm^2(Vs)^{-1}$ which is equal to that of an amorphous Si-MOSFET.

However, the organic semiconductor such as pentacene is disadvantageous in that thermal stability thereof is low (<150° C.), so that a practical device is not realized.

Recently, as a material applicable to the channel layer of TFT, an oxide material has been attracting attention.

For example, development of the TFT in which a transparent conductive oxide polycrystalline thin film mainly made of ZnO is used as the channel layer has been vigorously conducted.

The above-mentioned thin film can be formed at relatively low temperature and can be formed on the substrate such as a plastic plate or a plastic film.

However, a compound mainly made of ZnO cannot form a stable amorphous phase at room temperature, whereby it becomes a polycrystalline phase. Accordingly, it is impossible to increase an electron mobility by scattering in a polycrystalline grain boundary.

In addition, each shape of the polycrystalline particles and interconnection therebetween largely vary depending on a film forming method, so that characteristics of the TFT device also vary.

K. Nomura et al., Nature 432, 488 (2004) discloses a thin film transistor using an In—Ga—Zn—O-based amorphous oxide.

The transistor can be formed on a plastic substrate or a glass substrate at room temperature.

Further, transistor characteristics of a normally-off type transistor are obtained when a field effect mobility is about 6 to 9. In addition, the transistor has a feature of being transparent with respect to visible light.

On the other hand, if it is possible to produce a plurality of thin film transistors having different threshold voltages on a substrate, a high-performance circuit or a circuit suitable for an application uses can be achieved.

For example, Japanese Patent Application Laid-Open No. 2004-128487 discloses a technology of producing thin film transistors having different threshold voltages in a silicon-based TFT, and describes that the technology enables improvement of a circuit performance, for example, reduction in power consumption.

In the silicon-based thin film transistor, an element such as boron is doped in a channel layer so as to control the threshold voltage.

In order to produce TFTs having different threshold voltages, a doping concentration is adjusted for each of the TFTs having different threshold voltages.

A doping concentration is as small as about $10^{15}$ to $10^{18}$ atoms/$cm^3$, so that a method of controlling the doping concentration is limited, and ion implantation is generally employed.

According to the method, in order to form regions having different doping concentration on the substrate, it is necessary to adjust an amount of implanted ions for each region, and therefore repeat a step of implanting ions a plurality of times, thereby complicating the step.

On the other hand, a method of controlling the threshold voltage of the thin film transistor in which the amorphous oxide film is applied to the channel layer is unknown.

SUMMARY OF THE INVENTION

It is an object of the present invention to provide a technology of controlling a threshold voltage of a thin film transistor in which an amorphous oxide film is applied to a channel layer.

In addition, it is another object of the present invention to provide a semiconductor circuit such as an active matrix circuit used for a backplane of a display device by using the technology of controlling the threshold voltage.

In order to solve the above-mentioned problems, according to the present invention, there is provided a semiconductor apparatus, including a plurality of kinds of field effect transistors, wherein the plurality of kinds of field effect transistors each include a channel layer made of an amorphous oxide containing a plurality of kinds of metal elements, and an element ratio of the amorphous oxide is changed so that the respective threshold voltages of the plurality of kinds of field effect transistors are different from one another.

Further, according to the present invention, there is provided a method of manufacturing a semiconductor apparatus, including forming a plurality of kinds of field effect transistors on a substrate and forming an oxide thin film as a channel layer formed of each of the field effect transistors, wherein in the formation of oxide thin film, at least two different materials are simultaneously supplied to the substrate from different directions.

Further, according to the present invention, there is provided a method of manufacturing a semiconductor apparatus, including forming a plurality of kinds of field effect transistors on a substrate and forming an oxide thin film as a channel layer of each of the field effect transistors, wherein material sources for supplying materials of the oxide thin film are disposed in rows, and in the formation of the oxide thin film, the substrate is moved in a direction different from a direction in which the material sources are disposed.

Further features of the present invention will become apparent from the following description of exemplary embodiments with reference to the attached drawings.

DESCRIPTION OF THE EMBODIMENT

Hereinafter, an exemplary embodiment for carrying out the present invention will be described with reference to the attached drawings.

According to an embodiment of the present invention, there is provided a semiconductor apparatus including thin film transistors formed on a substrate, wherein channel layers thereof have different material compositions, whereby the transistors have different electric characteristics.

Figure 1:
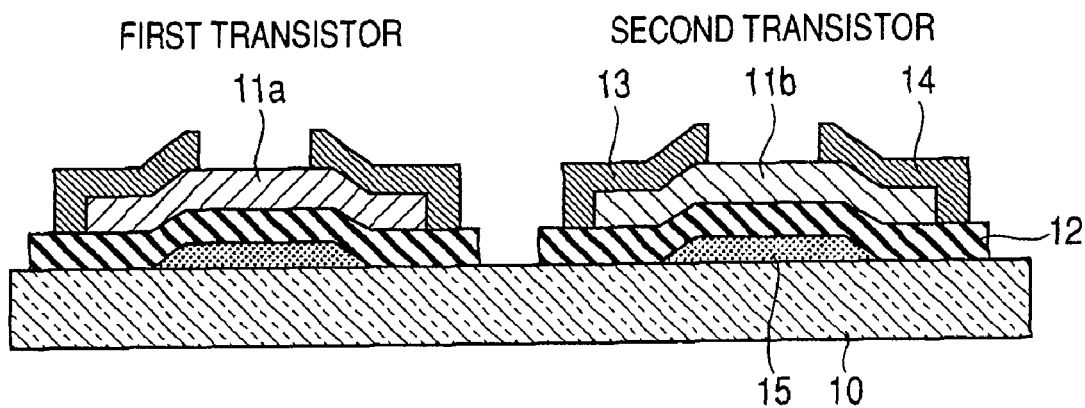
FIG. 1 is a cross-sectional diagram illustrating a structural example of a semiconductor apparatus including a plurality of kinds of thin film transistors according to one embodiment of the present invention.

FIG. 1 is a cross-sectional diagram illustrating a structural example of the semiconductor apparatus according to one embodiment of the present invention.

As illustrated in FIG. 1, the semiconductor apparatus according to the embodiment includes a plurality of kinds of field effect transistors (FETs).

In the cross-sectional diagram of FIG. 1, the semiconductor apparatus includes a substrate 10, channel layers (oxide thin films) 11a and 11b, gate insulating layers 12, source electrodes 13, a drain electrodes 14, and gate electrodes 15.

In FIG. 1, two transistors are illustrated, but an arbitrary number of transistors may be disposed as long as the number is two or more.

A first transistor and a second transistor exhibit different transistor characteristics because material compositions of the oxide thin films 11a and 11b serving as channel layers are different from each other.

Figure 2:
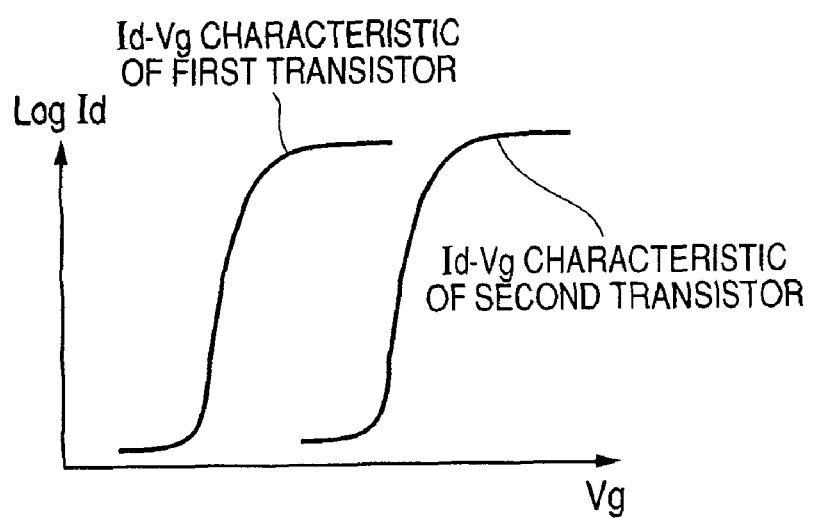
FIG. 2 is a graph illustrating an example of a difference between the plurality of kinds of thin film transistors according to one embodiment of the present invention.

FIG. 2 is a graph illustrating an example of different transistor characteristics.

According to the present embodiment, as illustrated in FIG. 2, the material compositions of the oxide semiconductor films 11a and 11b serving as channel layers are different from each other, so that a plurality of kinds of transistors having different Id-Vg characteristics (transfer characteristics) are formed on the substrate. In this case, referring to FIGS. 7A and 7B, characteristics of a field effect transistor according to the present embodiment will be described.

The field effect transistor is a 3-terminal device having the gate electrode 15, the source electrode 13, and the drain electrode 14.

The field effect transistor is an electronic active device having a function of switching a current Id flowing between the source electrode 13 and the drain electrode 14 by applying a voltage Vg to the gate electrode 15 to control the current Id flowing through the channel layer.

When the voltage Vd of about 5 to 20 V is applied between the source electrode and the drain electrode, the gate voltage Vg is switched between 0 V and 5 to 20 V, thereby enabling control (turning on/off) of the current Id flowing between the source electrode and the drain electrode.

Figure 7A:
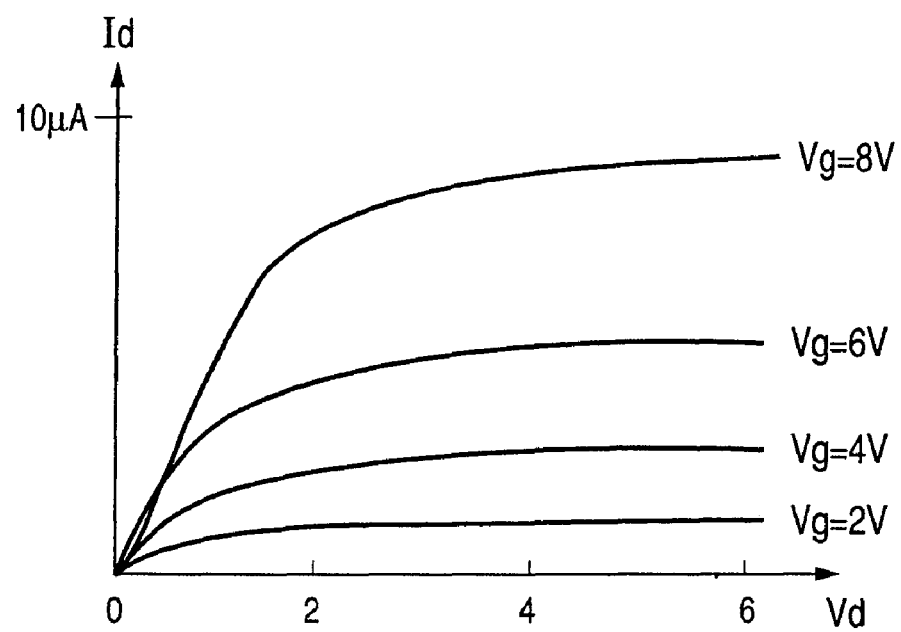
FIGS. 7A and 7B are graphs each illustrating TFT characteristics of the thin film transistor according to one embodiment of the present invention.
Figure 7B:
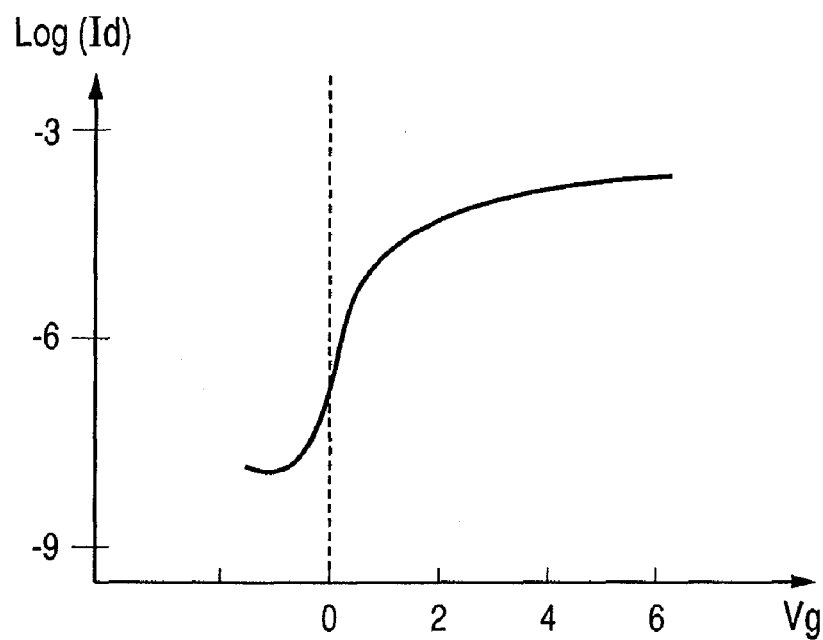

FIG. 7A illustrates an example of Id-Vd characteristics obtained at various voltages Vg, and FIG. 7B illustrates an example of Id-Vg characteristics (transfer characteristics) when Vd=6V.

The difference in characteristics due to a difference in element composition of a channel layer can be expressed as, for example, a difference in field effect mobility μ, threshold voltage (Vth), on/off ratio, and S value.

The field effect mobility can be obtained from characteristics of a linear region or a saturation region.

For example, it is possible to employ a method of creating a graph representing √Id-Vg from the results of the transfer characteristics to obtain the field effect mobility from an inclination of the graph. In the specification of the present application, as long as a particular method is intended, evaluation is performed by this method.

While there are some methods of obtaining the threshold value, the threshold voltage Vth can be obtained from, for example, an x-intercept of the graph representing √Id-Vg.

The on/off ratio can be obtained from a ratio of a largest Id value to a smallest Id value in the transfer characteristics.

The S value can be obtained from an inverse number of an inclination of a graph representing Log(Id)-Vd which is created from the results of the transfer characteristics.

A graph representing the Vg dependence on dVg/d(logId) is created from the transfer characteristics, and a minimum value obtained from the graph is set as the S value.

The difference in transistor characteristics is not limited to the above, but can be also represented by various parameters.

For example, in the transfer characteristics, the difference can be represented by a voltage Vo indicating a given fixed current value (for example, $10^{-8}$ A), or the like.

(Channel Layer Composition and Transistor Characteristics (Threshold Voltage))

Next, description is made of an oxide material constituting a channel layer of a thin film transistor which can be used for the semiconductor apparatus according to the present embodiment.

The material of the channel layer includes an amorphous oxide semiconductor thin film containing two or more metal elements.

While a type of the metal element is not particularly limited as long as the metal element can become an oxide, it is possible to use an oxide containing In or Zn in which a large electron mobility can be obtained.

In addition, the channel layer is desirably made of an amorphous oxide.

Further, the channel layer is more desirably made of an amorphous oxide containing In and Zn or an amorphous oxide containing In, Ga and Zn.

The inventor of the present invention has studied the thin film transistor in which the amorphous oxide is applied to the channel layer, and have found that there is a correlation between the electrical characteristics thereof, particularly, the threshold voltage, and the material composition of the thin film applied to the channel layer.

Figure 3A:
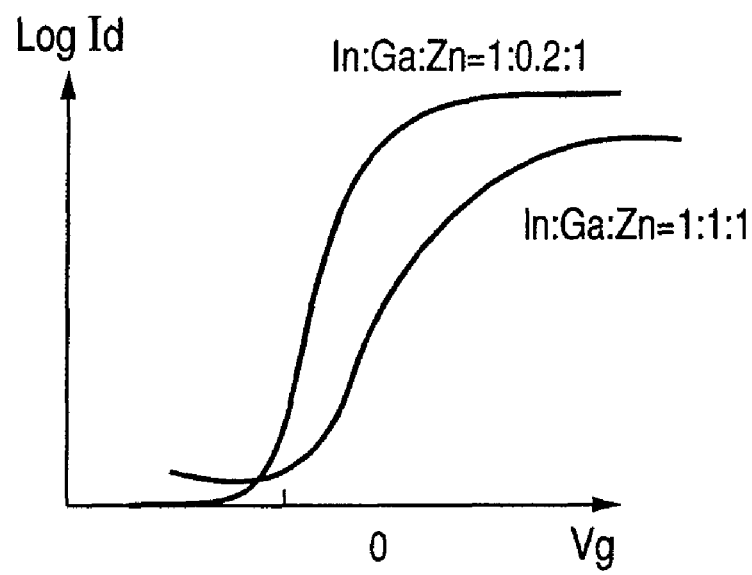
FIGS. 3A and 3B are graphs each illustrating characteristics of a thin film transistor according to Example 1 of the present invention.
Figure 3B:
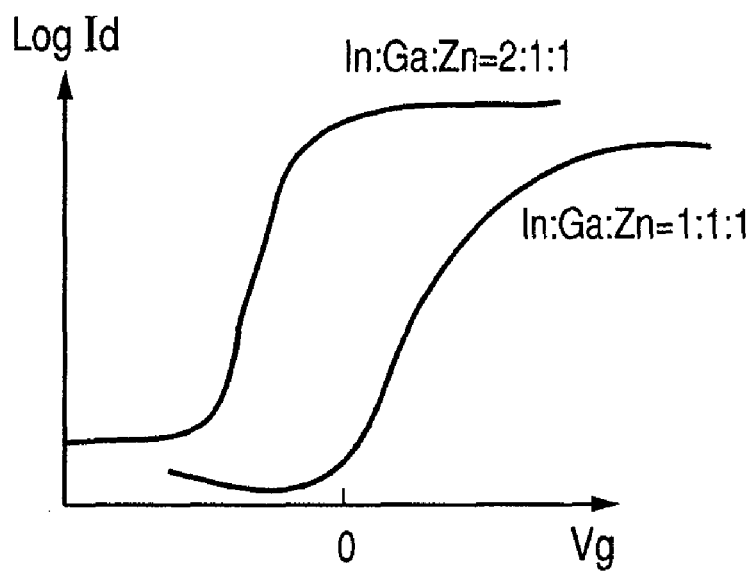

For example, with regard to the oxide TFT to which the channel layer made of the amorphous oxide containing In, Ga and Zn is applied, as illustrated in FIGS. 3A and 3B, the threshold voltage tends to be increased as a Ga composition ratio becomes larger.

In addition, the threshold voltage tends to be decreased as an In composition ratio becomes larger.

Further, with regard to the oxide TFT to which the channel layer made of the amorphous oxide containing In and Zn is applied, the threshold voltage tends to be small when the In composition ratio is large.

When the amorphous oxide is used, the threshold voltage can be controlled by changing a composition of a main component element (i.e., element contained at a ratio of atomic % or more).

Accordingly, the composition can be controlled at the time of formation of the channel layer, and evaluation of the composition can be easily performed.

In this case, description has been made of the case where the characteristics are changed according to the composition ratio of the metal elements, but it is also possible to prepare transistors having different characteristics by changing an amount of oxygen or an amount of hydrogen contained in the thin film.

(Arrangement of Thin Film Transistors)

Next, description is made of a method of arranging the above-mentioned thin film transistors having different characteristics.

Based on an electronic circuit design, the thin film transistors having different characteristics can be respectively arranged on arbitrary positions. The thin film transistors each having a desired composition are formed at desired positions, thereby achieving a desired circuit.

Particularly, in the circuit design, the design is performed using the transistors that are artificially made to have a plurality of threshold voltages, and the transistors are actually laid out, thereby achieving a high-performance semiconductor apparatus.

Particularly, an area within the surface of the substrate may be divided into regions so as to arrange the thin film transistors having different characteristics in each of the divided regions. Further, it is also possible to dispose field effect transistors on the substrate in rows and columns so as to be in a matrix form.

In addition, it is possible to dispose the thin film transistors whose characteristics are gradually changed depending on positions within the surface of the substrate.

In order to form some regions having different compositions, materials having different composition are prepared and used as the material sources to form the films at each region.

Specifically, it is possible to dispose material sources composed of different kinds of material, faced to each region in the substrate under deposition.

The semiconductor apparatus in which the device characteristics are gradually changed within the surface of the substrate can be achieved by performing film formation so that the composition is gradually changed within the surface of the substrate in the step of forming the channel layer. Further, in the case where the composition is gradually changed, the way of changing the composition can be periodically changed or monotonically changed.

A plurality of material sources with different compositions may be used to form the films having compositional variation depending on the positions on the substrate, where the compositional variation may be caused depending on a distance from each material source.

(Circuit Configuration)

Next, description is made of how to use the semiconductor apparatus according to the present embodiment, that is, the circuit including the thin film transistors having different threshold voltages.

The semiconductor apparatus according to the present embodiment can be applied to an active matrix substrate of, for example, a liquid crystal display (LCD), an organic electro-luminescence (EL) display, an electrophoretic display, and an optical sensor.

For example, in the active matrix substrate, in order to alleviate a gate wiring delay, the above-mentioned plurality of kinds of thin film transistors can be used.

Specifically, a threshold voltage of a pixel TFT may be lowered as departing from a gate line drive circuit.

As a result, it is possible to turn on the pixel TFT, which is placed apart from the gate line drive circuit, at low voltage, and reduce a charge time for a wiring capacity of the gate wiring.

In this manner, it is possible to turn on the pixel TFT with a shorter period of time than the conventional case over the entire screen of the display device.

The method is useful when the method is applied to a high-definition display device or a large-area display device, which is largely affected by the gate delay, and to a display device which requires high-speed display.

In addition, the method may be applied to a pixel circuit of an active matrix substrate.

In a case where a plurality of TFTs is provided to the pixel circuit, TFTs having different threshold voltages can be used as the TFTs.

Figure 5:
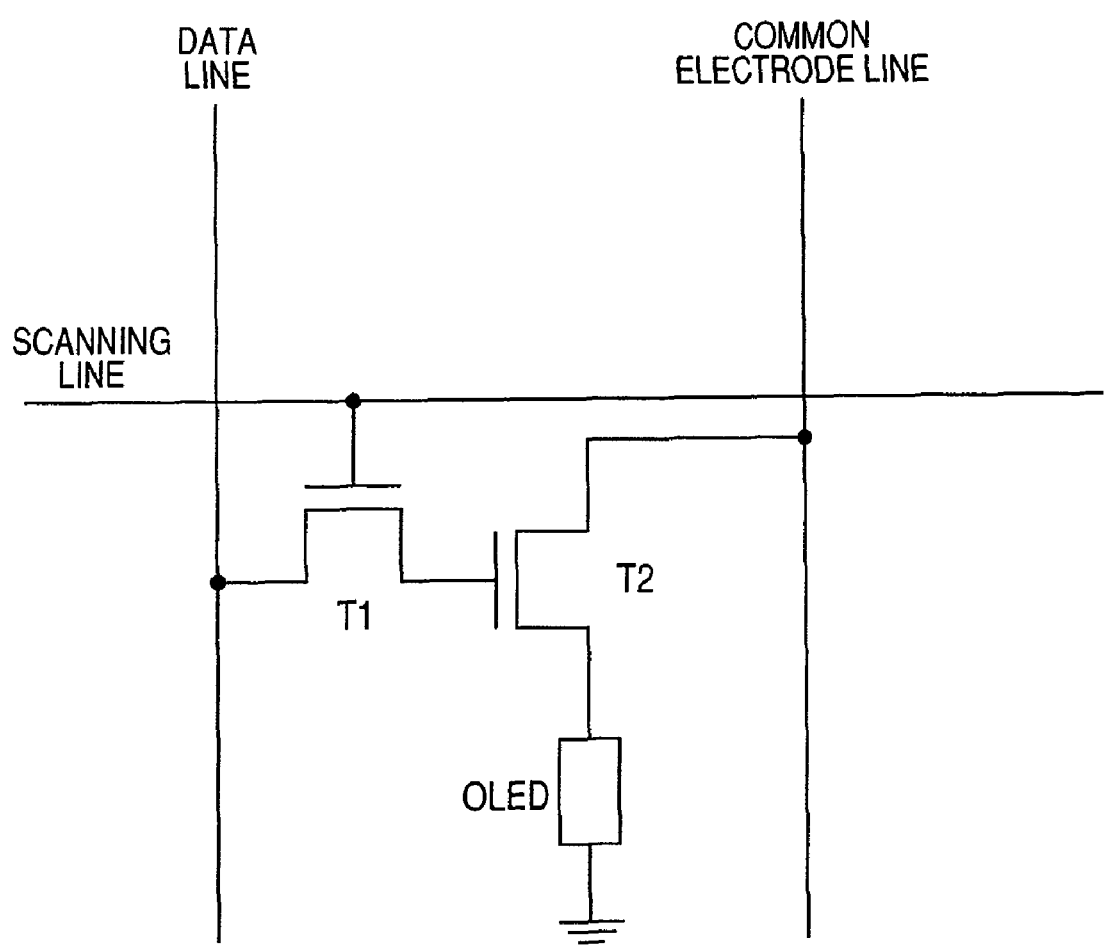
FIG. 5 is a diagram illustrating an example of a pixel circuit of an organic EL display device.

When a circuit having two transistors (T1 and T2) as illustrated in FIG. 5 is used as the pixel circuit, for example, TFTs having different threshold voltages may be used as the transistors.

In addition, in a circuit using four TFTs, an arbitrary number of TFTs among the four TFTs may have different threshold voltages.

Further, in a case where different display elements for emitting red (R), green (G) and blue (B) colors are used as in a color organic EL display device, transistors having different characteristics may be disposed so as to correspond to each of the display elements.

By the use of the circuit, it is possible to provide the display device with an improved drive controllability of the display elements and excellent image quality.

Further, as a peripheral circuit of the active matrix, transistors having different characteristics can be used for a gate driver, a data driver, a memory, a power supply circuit, and the like.

The transistors having different threshold voltages can be used in each circuit.

For example, the TFTs having different threshold voltages can be used in a circuit for performing digital processing, such as a logic circuit, and in a circuit for performing analog processing using a continuous quantity, such as an amplifier circuit.

Further, the use of a plurality of TFTs having different threshold voltages in each circuit enables higher performance.

For logical circuits such as an inverter circuit, a NOR circuit, a NAND circuit, a flip-flop circuit, and a shift register circuit, the thin film transistors having a plurality of threshold voltages can be appropriately used.

In addition, the thin film transistors can be applied to a memory circuit such as a static random access memory (SRAM) or a read only memory (ROM) or to an analog circuit such as a differential amplifier.

In addition, the method according to the present embodiment can be used to suppress the distribution in transistor characteristics which may be unpredictably generated.

For example, when the thin film transistors are to be formed over the substrate with a large area, the fluctuation of the characteristics may be caused over the surface of the substrate because of warp of the substrate itself, in-plane variation generated by the manufacturing apparatus, and variation in process.

In order to alleviate the fluctuation, it is possible to employ the method for composition control according to the present embodiment.

For example, In case it is needed to alleviate a smaller threshold voltage in TFT characteristics at the end portion of the substrate, film formation can be performed so that the Ga composition is set to be large at the end portion of the substrate in advance. As a result, it is possible to produce the backplane with high uniformity of the threshold voltages over the entire surface of the substrate.

(Thin Film Transistor)

Next, description is made of the structure of the oxide thin film transistor applied to the semiconductor apparatus according to the present embodiment.

FIG. 1 illustrates an example of a bottom gate structure in which the gate insulating layer 12 and the semiconductor channel layer 11 are formed in the stated order on the gate electrode 15. As the structure of the TFT, an arbitrary top/bottom gate structure, or a staggered/coplanar structure may be used.

(Channel)

In order to obtain desirable TFT characteristics, it is preferable to apply a semi-insulating amorphous oxide film having an electric conductivity of 10 S/cm or smaller and 0.000001 S/cm or larger, to the channel.

In order to obtain the electric conductivity, it is desirable to form the amorphous oxide film having an electron carrier concentration of about $10^{14}$ to $10^{18}/cm^3$ while depending on the material composition of the channel.

When the electric conductivity is more than 10 S/cm, the normally-off transistor cannot be formed, and the large on/off ratio cannot be achieved.

In an extreme case, even by the application of the gate voltage, the current flowing between the source electrode and the drain electrode is not turned on/off, and a transistor operation is not exhibited.

On the other hand, in a case of an insulator, that is, when the electric conductivity is smaller than 0.000001 S/cm, an ON-state current cannot be increased.

In an extreme case, even by the application of the gate voltage, the current flowing between the source electrode and the drain electrode is not turned on/off, and the transistor operation is not exhibited.

The electric conductivity of the oxide applied to the channel layer can be controlled by controlling an oxygen partial pressure at the time of film formation.

In other words, by controlling the oxygen partial pressure, an oxygen deficiency amount during the film formation is mainly controlled, thereby controlling the electron carrier concentration.

Actually, by controlling the oxygen partial pressure at high level, it is possible to obtain the semi-insulating film of the amorphous oxide film which has an electron carrier concentration of $10^{14}$ to $10^{18}/cm^3$ and has a semi-insulating property. By application of the thin film to the channel layer, a desirable TFT can be produced.

Further, when the oxygen partial pressure of the atmosphere at the time of film formation is changed, to evaluate the electron carrier concentration and the electron mobility of the amorphous oxide film tend to be increased by decreasing the oxygen partial pressure. The evaluation is performed by hall mobility measurement.

In a normal compound, as the carrier concentration is increased, the electron mobility is decreased due to scattering of carriers, while in the amorphous oxide according to the present embodiment, as the electron carrier concentration is increased, the electron mobility is increased. The physical mechanism thereof is not clear.

When the voltage is applied to the gate electrode, electrons can be injected in the channel layer of the amorphous oxide, so that the current flows between the source electrode and the drain electrode and an on-state is obtained between both electrodes.

In the amorphous oxide film, when the electron carrier concentration is increased, the electron mobility is also increased, so that the current obtained when the transistor is in an on-state can be made larger.

In other words, the saturation current and the on/off ratio can be further increased.

(Gate Insulating Layer)

In the transistor applicable to the present embodiment, the material of the gate insulating layer 12 is not particularly limited as long as the material has a good insulating property.

For example, as the gate insulating layer 12, it is possible to use one of $Al_2O_3$, $Y_2O_3$, $SiO_2$ and $HfO_2$, or a mixture containing at least two of them.

As a result, a leak current generated between the source electrode and the gate electrode and between the drain electrode and the gate electrode can be set to about $10^{-7}$ A.

(Electrode)

Each material of the source electrode 13, the drain electrode 14, and the gate electrode 15 is not particularly limited as long as good electric conductivity can be obtained and electric connection to the channel layer can be performed.

For example, a transparent conductive film made of, for example, $In_2O_3$:Sn, or ZnO, or a metal film made of, for example, Au, Pt, Al, or Ni can be used.

(Substrate)

As the substrate 10, a glass substrate, a plastic substrate, a plastic film, or the like can be used.

The above-mentioned channel layer and the gate insulating layer are transparent with respect to visible light, and therefore it is possible to obtain a transparent thin film transistor by using a transparent material as each material of the above-mentioned electrodes and substrate.

(Manufacturing Method)

As a method of forming an oxide thin film, it is desirably used a vapor phase method such as a sputtering method (SP method), a pulsed laser deposition method (PLD method), and an electron beam deposition method.

It should be noted that, among the vapor phase methods, the SP method is suitable from the viewpoint of mass productivity. However, the deposition method is not limited to those methods.

A substrate temperature at the time of film formation can be maintained substantially at room temperature in a state where the substrate is not intentionally heated.

The method can be executed during a low-temperature process, so that the thin film transistor can be formed on the substrate such as a plastic plate or a film.

Particularly, as a method of forming the thin film having an element composition gradually changed over the entire surface of the substrate, two or more materials may be simultaneously supplied from different directions as illustrated in FIG. 9 to thereby form the oxide thin film having an element composition distributed over the surface of the substrate.

Figure 10A:
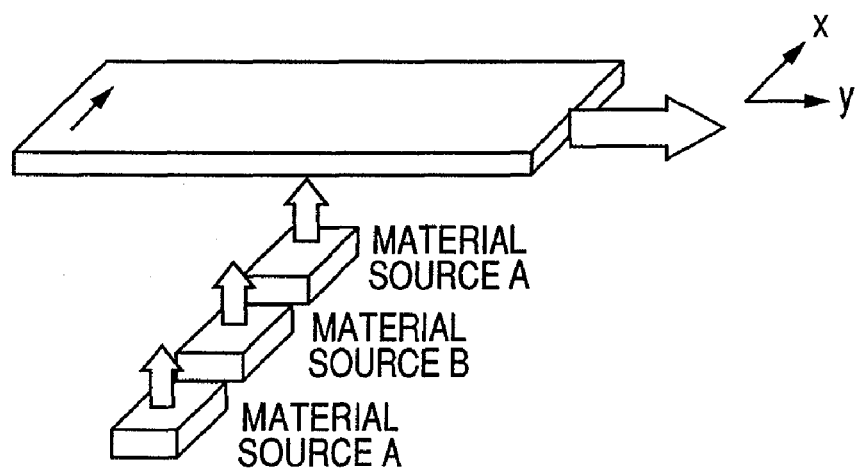
FIG. 10A is a diagram illustrating a method and an apparatus for forming a thin film whose composition is distributed on a substrate.

In addition, it is possible to employ a method in which plate-shaped material sources (material source A and material source B) with different material compositions are provided in a direction indicated by the arrow x so as to oppose the substrate as illustrated in FIG. 10A, to thereby supply the materials to the substrate.

In this case, by moving the substrate in a direction indicated by the arrow y, it is possible to perform film formation on the large-area substrate. In FIG. 10A, the number of material sources is three as an example, but an arbitrary number of material sources can be used.

In the above-mentioned semiconductor apparatus (active matrix substrate), the transparent substrate and the amorphous oxide TFT are used, so that when the semiconductor apparatus is applied to a display device, an aperture ratio of the display device can be increased.

Particularly, when the semiconductor apparatus is used for the organic EL display, it is possible to employ a structure for taking out light also from the substrate side (bottom emission).

The semiconductor apparatus according to the present embodiment may be used for various uses of, for example, an ID tag or an IC tag.

EXAMPLE 1

Example 1 is an example in which a semiconductor apparatus including bottom gate type TFT elements having different threshold voltages was formed on a glass substrate.

In Example 1, an In—Ga—Zn—O-based amorphous oxide is used for the channel layer 11a and 11b of the transistor. A channel length of the transistor is 60 μm, and a channel width thereof is 180 μm.

First, on a glass substrate 10 (1737 manufactured by Corning Incorporated), the gate electrode 15 and the gate insulating layer 12 are patterned and formed by a photolithographic method and a lift-off method.

The gate electrode 15 is formed of a Ta film having a thickness of 50 nm. The gate insulating layer is obtained by forming an $SiO_2$ film by the sputtering method, and has a thickness of 150 nm. In addition, a dielectric constant of the $SiO_2$ film is about 4.6.

Next, the channel layer of the first transistor was patterned and formed by the photolithographic method and the lift-off method.

The channel layer 11a of the first transistor is formed of an In—Ga—Zn—O-based amorphous oxide, and a composition thereof is represented as In:Ga:Zn=1:0.2:1.

The In—Ga—Zn—O-based amorphous oxide film was formed by the radio-frequency sputtering method in an atmosphere of a mixture of argon gas and oxygen gas.

Figure 8:
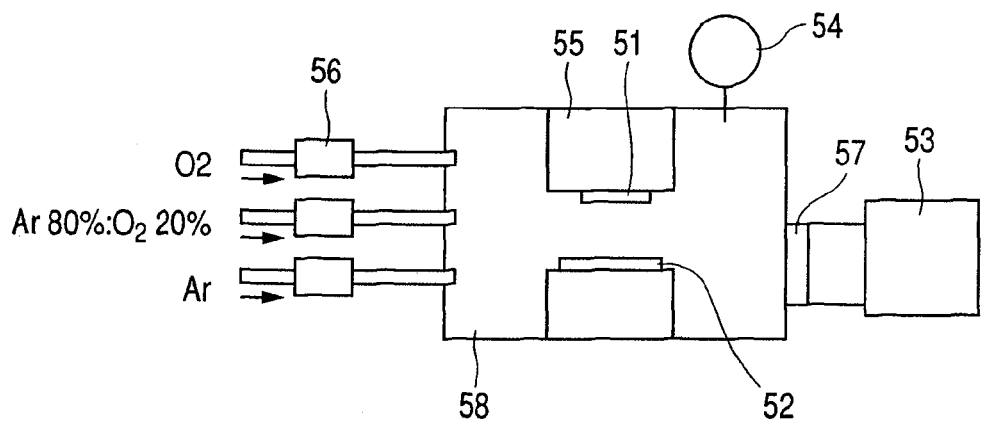
FIG. 8 is diagram illustrating one example of an apparatus for manufacturing an oxide film of the thin film transistor according to one embodiment of the present invention.

A sputtering film formation apparatus as illustrated in FIG. 8 is used.

As illustrated in FIG. 8, the sputtering film formation apparatus includes a sample 51, a target 52, a vacuum pump 53, a vacuum gauge 54, a substrate holding unit 55, gas flow rate control units 56 each provided to each gas introduction system, a pressure control unit 57, and a deposition chamber 58.

In other words, the sputtering film formation apparatus includes the film formation chamber 58, the vacuum pump 53 for vacuum pumping the deposition chamber, and the substrate holding unit 55 for holding the substrate, on which the oxide film is to be formed, within the deposition chamber. In addition, the sputtering film formation apparatus includes the solid material source (target) 52 disposed so as to oppose the substrate holding unit 55, an energy source (high-frequency power supply; not shown) for evaporating the material from the solid material source, and a unit for supplying an oxygen gas into the film formation chamber.

The gas introduction systems include three systems for argon, oxygen, and a mixture gas of argon and oxygen (Ar:$O_2$=80:20). By providing the gas flow rate control unit 56 capable of independently controlling each gas flow rate, and the pressure control unit 57 for controlling an exhaust velocity, it is possible to obtain a predetermined gas atmosphere in the film formation chamber.

According to Example 1, three targets (material sources) are used to thereby simultaneously perform film formation (in FIG. 8, for simplification, only one target is illustrated).

The three targets are polycrystalline sintered bodies of $In_2O_3$, $Ga_2O_3$, and ZnO, respectively, each having a size of 2 inches.

By controlling input RF power to each of the targets, it is possible to obtain an oxide thin film having a desired composition ratio of In:Ga:Zn.

Under the atmosphere, the total pressure is 0.5 Pa and the gas flow rate of this case is represented as $Ar:O_2=100:1$. The film formation rate is about 13 nm/min, and the substrate temperature is 25° C.

Subsequently, the channel layer of the second transistor was patterned and formed by the photolithographic method and the lift-off method.

The channel layer of the second transistor is formed of the amorphous oxide film 11b having a second composition (In:Ga:Zn=1:1:1).

The method of forming the channel layer 11b is based on the method of forming the amorphous oxide film 11a of the first transistor, but the power to be input to each cathode at the time of film formation is changed.

As a result, the composition of the amorphous oxide film 11b of the second transistor is different from that of the amorphous oxide film 11a of the first transistor.

As a result of an analysis using a fluorescence X-ray (XRF), the metal composition ratio of the amorphous oxide film 11a of the first transistor was In:Ga:Zn=1:0.2:1. Further, the metal composition ratio of the amorphous oxide film 11b of the second transistor was In:Ga:Zn=1:1:1.

It is found that the oxide films 11a and 11b are amorphous films because a clear diffraction peak was not detected in X-ray diffraction (by thin-film method and at an incident angle of 0.5°)

The oxide films 11a and 11b each have a thickness of about 50 nm.

In addition, from the analysis of photoabsorption spectrum, it is apparent that the produced amorphous oxide films each have a forbidden energy band gap of about 3 eV, and are each transparent with respect to visible light.

(Characteristic Evaluation of TFT Device)

The produced thin film transistor exhibited typical transistor characteristics as illustrated in FIGS. 7A and 7B.

FIG. 7A illustrates the Id-Vd characteristics, and FIG. 7B illustrates the Id-Vg characteristics.

As illustrated in FIG. 7A, when the dependence of the drain voltage Vd on the current Id flowing between the source electrode and the drain electrode in association with the change of the voltage Vd was measured, a typical behavior of the semiconductor transistor that Vd is saturated (pinched off) around Vd=6 V was exhibited. In this case, the gate voltage Vg is constant.

FIG. 3A illustrates the Id-Vg characteristics of the first transistor and the second transistor while comparing them with each other.

The threshold voltage of the first transistor is 0.5 V, and the threshold voltage of the second transistor is 2.5 V. In addition, the field effect mobility of the first transistor was about 8 $cm^2(Vs)^{-1}$, and the field effect mobility of the second transistor was about 6 $cm^2 (Vs)^{-1}$.

The on/off ratio of the transistors exceeded $10^6$. In other words, it is apparent that when the Ga composition ratio of the channel layer is decreased, the threshold voltage is decreased and the field effect mobility is increased.

In the same manner as described above, as a third transistor, a thin film transistor including a channel layer having a large In composition ratio (In: Ga:Zn=2:1:1) was formed on the same substrate. Then, as illustrated in FIG. 3B, the transfer characteristics were observed in which the threshold voltage of the third transistor is smaller than that of the second transistor and the field effect mobility of the third transistor is larger than that of the second transistor.

According to Example 1, it is apparent that the transistors including the amorphous oxides having different composition ratios are disposed, thereby achieving the semiconductor apparatus including the transistors having different characteristics such as the threshold voltage and the field effect mobility.

The field effect transistors having different threshold voltages can contribute to achievement of higher performance and lower power consumption of various semiconductor circuits such as an operation circuit for an organic light-emitting diode.

EXAMPLE 2

Example 2 is an example of an active matrix circuit substrate on which TFTs having different threshold voltages are arranged in a matrix form.

In Example 2, an In—Zn—O-based amorphous oxide is used for the channel layers 11a and 11b of the transistor.

Further, the composition ratio In:Zn of the amorphous oxide is gradually changed in a gate wiring direction of the active matrix.

As a result, the active matrix circuit substrate having a small gate delay is achieved.

A method of forming the thin film transistor is based on Example 1, but a thin film with the composition ratio In:Zn gradually changed in the gate wiring direction is formed in the step of forming the channel layer. Further, matrix wirings are separately formed by a general method.

Figure 9A:
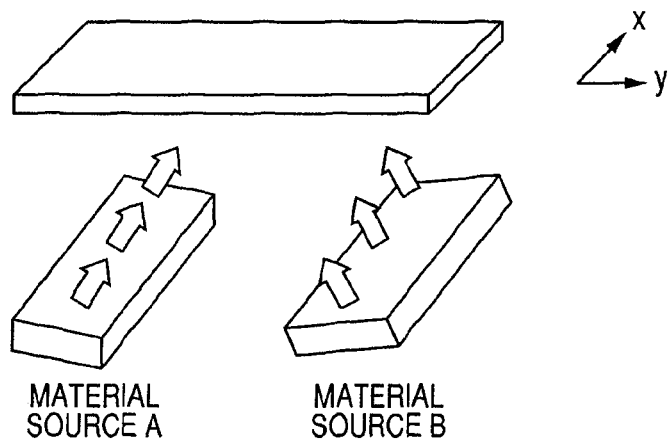
FIG. 9A is diagram illustrating a method and an apparatus for forming a thin film whose composition is distributed on a substrate.

The channel layer according to Example 2 is formed by using a film formation apparatus having a structure as illustrated in FIG. 9A.

As illustrated in FIG. 9A, there is employed a method of providing the material source A and the material source B to the substrate so as to form, on the substrate, the thin film in which compositions of a material A and a material B are gradually changed. The sputtering method is employed to form a film.

In Example 2, a polycrystalline sintered body containing $In_2O_3.ZnO$ is used as the material source A, and a polycrystalline sintered body containing $In_2O_3.2ZnO$ is used as the material source B.

Figure 9B:
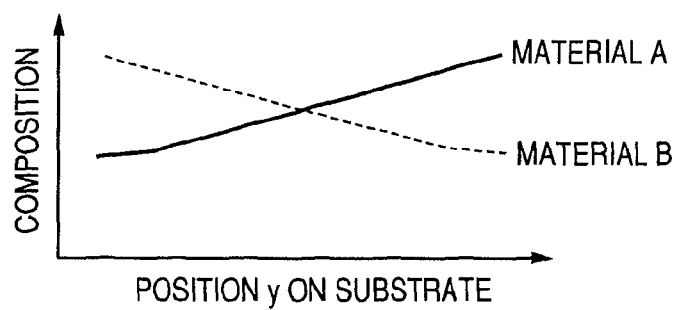
FIG. 9B is a diagram illustrating a distribution of the composition.

As illustrated in FIG. 9B, the thin film with the composition ratio In:Zn gradually changed in the direction indicated by the arrow y of FIG. 9A is obtained.

A substrate size is 5 square cm, and the direction y of FIG. 9A corresponds to the gate wiring direction of the active matrix.

As a result, it is possible to obtain the active matrix substrate on which the thin film transistors having different electric characteristics (threshold voltages) are arranged in the direction y (gate wiring direction).

The atmosphere at the time of channel formation has the total pressure of 0.4 Pa, and the gas flow rate of this case is represented as $Ar:O_2=100:2$. The deposition rate is about 12 nm/min, and the substrate temperature is 25° C.

Figure 4A:
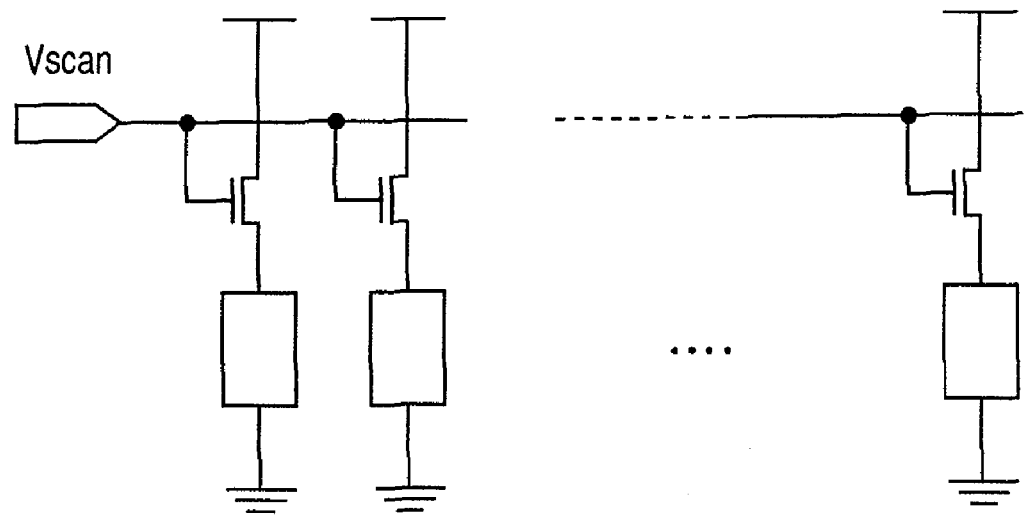
FIGS. 4A and 4B are diagrams each illustrating a gate wiring circuit and an equivalent circuit of an active matrix circuit.
Figure 4B:
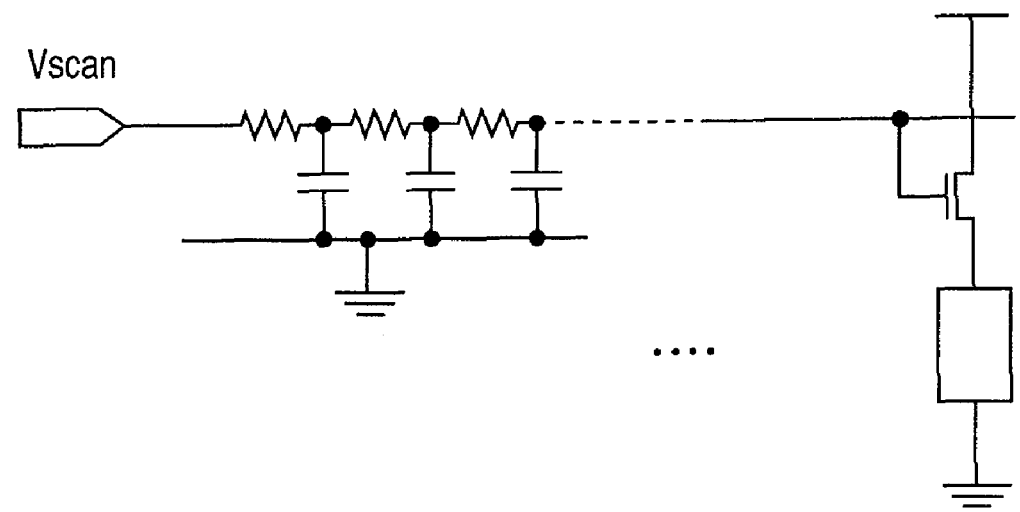

Referring to FIGS. 4A and 4B, the gate delay of the active matrix will be described.

FIG. 4A illustrates an electrical circuit at the time of focusing on one gate wiring, and FIG. 4B illustrates an equivalent circuit of FIG. 4A.

The wiring signal delay is proportional to a wiring resistance $R_{wire}$ and a wiring capacity $C_{wire}$.

Conventionally, in order to reduce the signal delay, the electrical circuit is designed while, for example, reducing $R_{wire}$ by increasing a width of the wiring, or reducing $C_{wire}$ by increasing a thickness of the insulating layer.

However, according to those methods, the aperture ratio is lowered, for example, which decreases a degree of freedom of design of the display device.

In addition, in order to reduce the gate wiring delay, various measures, for example, providing gate line drive circuits at both ends of the active matrix display device are promoted, but further improvement is desired.

In Example 2, as departing from the gate line drive circuit, the In composition ratio in the material composition of the channel layer of the TFT is increased.

As a result, in Example 2, as departing from the gate line drive circuit, the threshold voltage of the TFT is decreased.

As a result, it is possible to turn on the pixel TFT, which is placed apart from the gate line drive circuit, at low voltage, and shorten the charge time for the wiring capacity of the gate wiring.

As described above, over the entire screen of the display device, the pixel TFTs can be turned on with a shorter period of time than the conventional case.

As in Example 2, the plurality of kinds of thin film transistors having different threshold voltages is applied to the active matrix substrate, thereby alleviating the gate wiring delay.

In a case of producing the active matrix display device with high definition and with a large screen, the number of gate wirings is increased, and the length of the gate wiring is increased (thinly made), which makes the problem of the gate wiring delay more serious.

The method according to Example 2 is effective to alleviate the problem.

Further, by the use of the above-mentioned structure, it is possible to alleviate the problem of the gate delay. Accordingly, by the use of the above-mentioned structure, the finer and/or thinner gate wiring is applicable in the active matrix. the thinner insulating layer provided around the gate wiring is also applicable. This means that the above-mentioned structure increases the degree of freedom of design of the display device.

According to the method of Example 2, the plurality of oxide semiconductors having different compositions can be formed at one film formation, thereby enabling formation of the semiconductor devices having different characteristics with high productivity.

When the liquid crystal display device is produced by using the active matrix circuit substrate according to Example 2, it is possible to obtain the display device in which the element variation in the gate wiring direction is small and the image quality is excellent.

EXAMPLE 3

Example 3 provides an active matrix circuit substrate on which TFTs having different threshold voltages are arranged in a matrix form on a plastic substrate.

When the active material matrix substrate including oxide semiconductors whose composition ratios are the same is formed on the entire substrate by employment of the method according to Example 1, distribution in device characteristics may be generated depending on the material of the plastic substrate and process conditions.

For example, when a polyethylene terephthalate (PET) film is used as the substrate, the field effect mobility was smaller at the end portion of the substrate, in some cases, than at the central portion of the substrate (comparative example).

In forming the channel layer of Example 3, a film formation apparatus having a structure as illustrated in FIG. 10A is used.

As illustrated in FIG. 10A, there is employed a method of providing the material source A and the material source B to the substrate so as to form, on the substrate, the thin film in which compositions of the material A and the material B are gradually changed.

According to the method, the substrate is moved in the direction y of FIG. 10A at the time of film formation, thereby enabling film formation in a large area.

As the film forming method, the sputtering method is employed.

In Example 3, a polycrystalline sintered body containing $In_2O_3.ZnO$ is used as the material source A, and a polycrystalline sintered body containing $InGaZnO_4$ is used as the material source B.

Figure 10B:
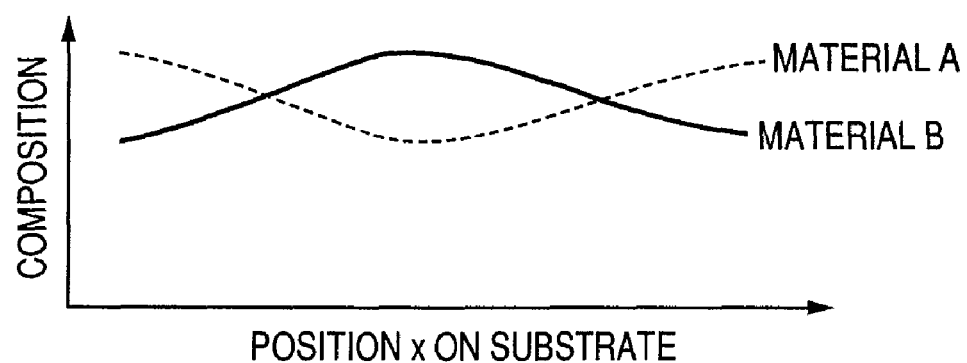
FIG. 10B is a diagram illustrating a distribution of the composition.

As illustrated in FIG. 10B, a thin film having the composition ratio gradually changed in the direction indicated by the arrow x of FIG. 10A is obtained.

The Ga composition ratio at an end portion of the substrate is smaller than that at a central portion thereof.

As a result, the active matrix substrate on which the thin film transistors having different electrical characteristics (threshold voltages) are gradually formed is achieved.

At the end portion of the substrate, the Ga composition is small, so that it is possible to obtain the transistor having a small threshold voltage and a large electron mobility.

As a result, it is possible to alleviate the distribution in transistor characteristics generated in the comparative example, and obtain the matrix substrate with greater uniformity.

As in Example 3, in order to reduce the distribution in transistor characteristics within the substrate, it is possible to gradually change (adjust) the composition ratio of In:Ga:Zn within the surface of the substrate.

According to the method of Example 3, the plurality of oxide semiconductors having different compositions can be formed at one film formation, thereby enabling formation of the semiconductor devices having different characteristics on the substrate with high productivity.

When the display device is produced by the use of the active matrix circuit substrate according to Example 3, it is possible to obtain the display device in which the element variation in the gate wiring direction is small and the image quality is excellent.

The semiconductor formed on a PET film was bent with a curvature radius of 30 mm and transistor characteristics were measured in the similar manner, but the transistor characteristics were not greatly changed.

In addition, the similar measurement was performed by application of visible light, but the transistor characteristics were not greatly changed.

The thin film transistor produced in Example 3 is transparent with respect to the visible light, and is formed on the flexible substrate.

EXAMPLE 4

Example 4 is an example of using TFTs having different threshold voltages, for pixel circuits of an active matrix organic EL display device.

In the pixel circuit having two transistors (T1 and T2) as illustrated in FIG. 5, the TFTs having different threshold voltages are used as the transistors T1 and T2.

Generally, different voltage levels are used for a common electrode line and a scanning line. However, in Example 4, compositions of the channel layers of the transistors T1 and T2 are adjusted and each threshold voltage is adjusted, thereby enabling application of the same voltage to the common electrode line and the scanning line. As a result, an outer circuit can be simplified.

EXAMPLE 5

Example 5 provides an active matrix of a color organic EL display device employing TFTs having different threshold voltages for each sub-pixel.

The color organic EL display device uses different display elements (organic EL) for R, G and B.

In Example 5, the difference in electrical characteristics of the display elements (organic EL) for R, G and B is taken into consideration, and different thin film transistors having different electrical characteristics (transistors having different composition ratios of channel layers) are disposed for each display element.

It is possible to dispose the transistors having different characteristics depending on the difference in characteristic of the display device, which improves the controllability as the display device.

By the use of the above-mentioned circuit, it is possible to provide the display device in which color controllability is improved and image quality is excellent.

EXAMPLE 6

Example 6 is an example where transistors having different threshold voltages are applied to an inverter circuit.

Figure 6A:
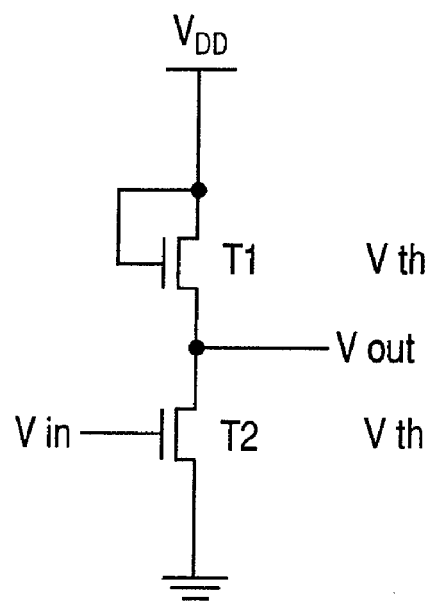
FIGS. 6A and 6B are circuit diagrams each illustrating an E/E inverter circuit and an E/D inverter circuit.
Figure 6B:
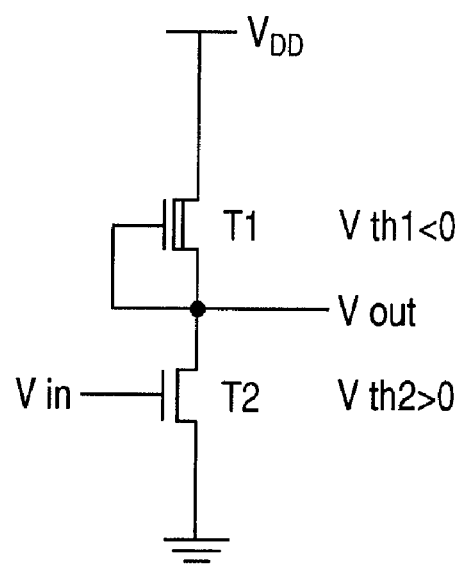

In Example 6, two types of transistors having different threshold voltages (positive and negative) are used to configure an E/D inverter circuit as illustrated in FIG. 6B.

The composition ratio of the channel layer of the transistor T2 having the positive threshold voltage is represented as In:Ga:Zn=1:1:2, and the composition ratio of the channel layer of the transistor T1 having the negative threshold voltage is represented as In:Ga:Zn=2:1:1.

The threshold voltage of the transistor T2 is +2.5 V, and the threshold voltage of the transistor T1 is −2 V.

As a comparative example, an E/E inverter circuit as illustrated in FIG. 6A is configured by using one of the transistors T1 and T2 having the composition ratio of the channel layer, that is, In Ga:Zn=1:1:2.

The circuit according to Example 6 enables a high-speed inverter operation as compared with the circuit according the comparative example.

By providing the E/D inverter circuit including the transistor having the positive threshold voltage and the transistor having the negative threshold voltage, it is possible to realize the high-speed operation.

The semiconductor apparatus according to the present invention includes the amorphous oxide semiconductor films having different compositions formed on the substrate. The amorphous oxide semiconductor film is used for the semiconductor element such as a thin film transistor, a Schottky diode element, a PN junction element, and a resistance element.

The semiconductor device using the amorphous oxide semiconductor according to the present invention is widely applied to, for example, a pixel circuit or a drive circuit of an LCD or an organic EL display, an IC card, or an ID tag.

The amorphous oxide semiconductor is favorable for application to a flexible display formed on a resin substrate because thin film formation thereof can be performed at low temperature. In addition, the amorphous oxide semiconductor is favorable for application to a see-through type display because the amorphous oxide semiconductor can be made to be transparent with respect to the visible light.

According to the present invention, it is possible to provide a semiconductor apparatus including semiconductor devices having different electrical characteristics.

In particular, it is possible to provide the semiconductor apparatus including thin film transistors having different threshold voltages.

Those semiconductor devices enable enhancement of the degree of freedom of design of a circuit, and improvement of the controllability of the circuit, thereby realizing the circuit with high performance.

In particular, it is possible to provide a TFT substrate (backplane) for a display device in which the gate wiring delay of the active matrix substrate is alleviated.

In addition, it can be expected to realize a circuit having small power consumption and a circuit capable of performing a high-speed operation.

Further, the oxide semiconductor is used, so it is possible to make the semiconductor apparatus transparent with respect to the visible light.

Further, the semiconductor apparatus can be formed at room temperature, so it is advantageous in that the semiconductor device can be formed on the plastic substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-262619, filed Sep. 27, 2006, which is hereby incorporated by reference herein in its entirety.

What is claimed is:

1. A semiconductor apparatus comprising a plurality of transistors each containing a channel layer with a different composition, wherein:

the channel layer of each of the plurality of transistors is made of an amorphous oxide containing at least two different metal elements;

the amorphous oxide contains In;

an element ratio of the number of atoms of In to the total number of atoms of the metal elements is changed so that respective threshold voltages of the plurality of transistors are different from one another; and the threshold voltage of each of the plurality of transistors is decreased by increasing the element ratio of the total number of atoms of In to the total number of atoms of the metal elements.

2. A semiconductor apparatus according to claim 1, wherein:

the amorphous oxide contains at least Ga, In, and Zn.

3. A semiconductor apparatus according to claim 1, wherein:

the plurality of transistors is arranged in rows and columns on a substrate;

the plurality of transistors each include a gate electrode, gate electrodes of the transistors being connected to one another via a common wiring; and the element ratio of the number of atoms of In to the total number of atoms of the metal elements is monotonically changed in the row.

4. A semiconductor apparatus according to claim 1, wherein:

the plurality of transistors is arranged in rows and columns in a matrix form on a substrate;

the plurality of transistors each include a gate electrode, gate electrodes of the transistors disposed in each column being connected to one another via a common wiring; and the element ratio of the number of atoms of In to the total number of atoms of the metal elements is monotonically changed in the column.

5. A semiconductor apparatus according to claim 1, wherein:

the channel layer contains at least one element selected from the group of Ga and Zn; and the element ratio of the number of atoms of In to the total number of atoms of the metal elements is In/(In+Ga+Zn), In/(In+Ga), or In/(In+Zn).

* * * * *